United States Patent
Carter, Jr. et al.

(10) Patent No.: US 6,365,976 B1
(45) Date of Patent: Apr. 2, 2002

(54) INTEGRATED CIRCUIT DEVICE WITH DEPRESSIONS FOR RECEIVING SOLDER BALLS AND METHOD OF FABRICATION

(75) Inventors: Buford H. Carter, Jr., Richardson; Dennis D. Davis, Garland; David R. Kee, Richardson; Richard E. Johnson, Flower Mound, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/511,320

(22) Filed: Feb. 23, 2000

Related U.S. Application Data
(60) Provisional application No. 60/121,555, filed on Feb. 25, 1999.

(51) Int. Cl.[7] .......................... H01L 23/48; H01L 29/52
(52) U.S. Cl. ...................... 257/779; 257/693; 257/678; 257/738; 257/737
(58) Field of Search ................................ 257/678, 693, 257/779, 738, 737

(56) References Cited

U.S. PATENT DOCUMENTS

| | | | | |
|---|---|---|---|---|
| 5,293,072 A | * | 3/1994 | Tsuji et al. | 257/737 |
| 5,962,918 A | * | 10/1999 | Kimura | 257/738 |
| 5,977,632 A | * | 11/1999 | Beddingfield | 257/737 |
| 6,107,109 A | * | 8/2000 | Akram et al. | 438/15 |
| 6,207,548 B1 | * | 3/2001 | Akram et al. | 438/613 |

* cited by examiner

*Primary Examiner*—Jhihan B Clark
(74) *Attorney, Agent, or Firm*—Gary C. Honeycutt; Fred Telecky; Arthur I. Navarro

(57) ABSTRACT

A semiconductor device, especially a Ball Grid Array or Chip Scale Package, comprising an integrated circuit chip having at least one input/output terminal; a body of encapsulation material molded around said chip, forming a generally flat surface including at least one dimple having a suitable size and shape to receive a solder ball or solder paste; and said dimple having an electrically conductive solderable surface connected to said terminal.

9 Claims, 3 Drawing Sheets

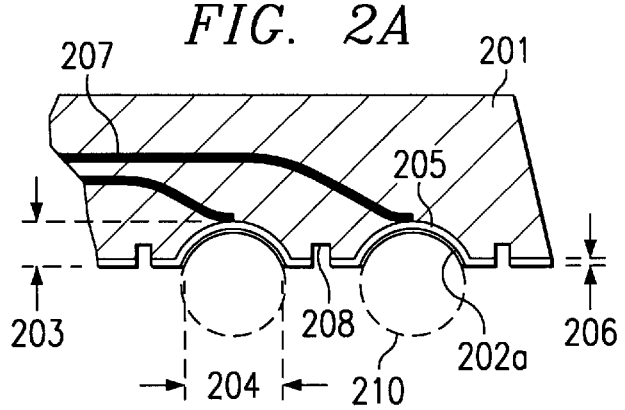
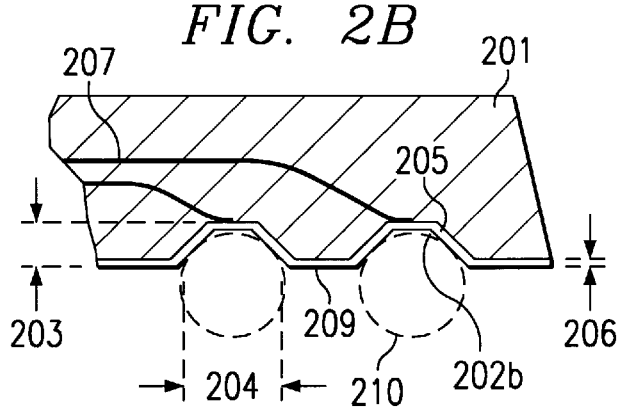
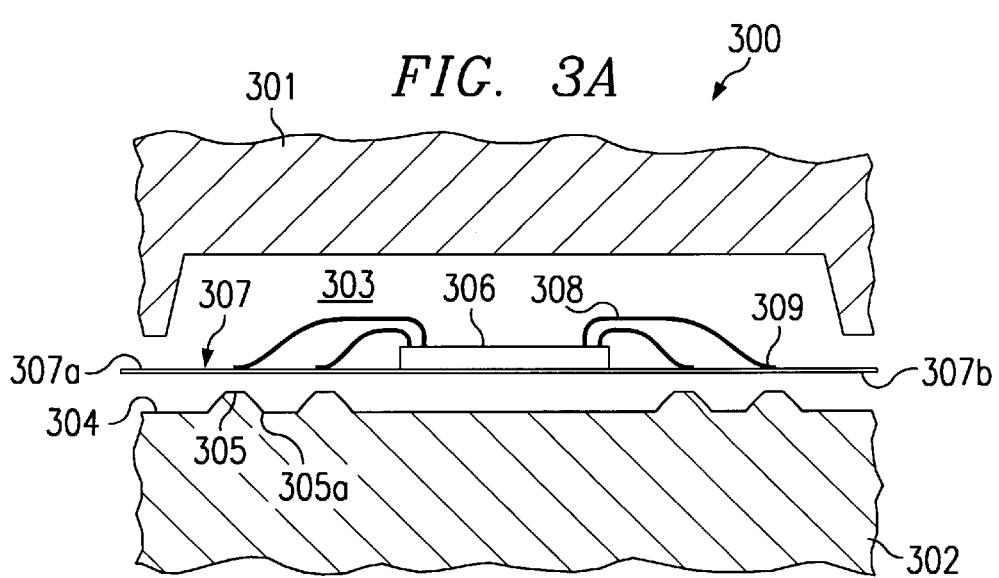

INTEGRATED CIRCUIT DEVICE WITH DEPRESSIONS FOR RECEIVING SOLDER BALLS AND METHOD OF FABRICATION

This application claims priority under 35 USC § 119 based upon Provisional Patent Application No. 60/121,555, filed Feb. 25. 1999.

FIELD OF THE INVENTION

The present invention is related in general to the field of semiconductor devices and processes and more specifically to molded low-cost ball grid array and chip scale packages and method of fabricating depressions for receiving solder balls.

DESCRIPTION OF THE RELATED ART

The trend in semiconductor technology to double the functional complexity of its products every 18 months (Moore's "law"), which is still valid today after having dominated the industry for the last three decades, has several implicit consequences. First, the cost per functional unit should drop with each generation of complexity so that the cost of the product with its doubled functionality would increase only slightly. Second, the higher product complexity should largely be achieved by shrinking the feature sizes of the chip components while holding the package dimensions constant; preferably, even the packages should shrink. Third, the increased functional complexity should be paralleled by an equivalent increase in reliability of the product. And fourth, but not least, the best financial profit rewards were held out for the ones who were ahead in the marketplace in reaching the complexity goal together with offering the most flexible products for application.

While plastic ball grid array (BGA) and chip-scale packages (CSP) became very popular in the last few years, they have been limited to fully participate in the trends for Moore's law due to a number of shortcomings. It turned out to be difficult to reduce the cost of BGAs and CSPs due to high content of plastic materials and the fixed number of fabrication process steps. The reliability of plastic BGAs and CSPs suffers from sensitivity to thermo-mechanical stress and moisture absorption. It is difficult to adjust the package designs to custom requirements; consequently, the package designs are not flexible enough to fit the general application trends towards smaller package outlines and thinner profiles.

Known technology focuses the attention for developing BGA and CSP package designs and processes on devices with high lead counts (or solder ball numbers) and neglects the specific needs of BGAs and CSPs for smaller lead (or solder ball) numbers. Thus, opportunities in the huge application market requiring specifically low solder ball numbers go unattended.

In the present state of the art, plastic packages with small pin count use stamped or etched leadframes; these leadframes represent the dominant materials cost in these packages. Plastic BGAs and CSPs, use patterned polyimide films are as substrates for mounting the semiconductor chips; these films represent the dominant materials cost in these packages. In addition, the techniques used in present technology for attaching solder balls (or bumps) to the packages is unsatisfactory because of problems related to ball adhesion, missing balls, or ball duplication. The fabrication processes employed and the inspections required are hindering cost reductions.

SUMMARY OF THE INVENTION

According to the present invention for integrated circuit (IC) devices, the molding process for encapsulating the device is used to form depressions of suitable size and shape to receive solder balls, while these depressions are structured such that they have an electrically conductive and solderable surface which is electrically connected to the input/output terminals of the IC chip.

The present invention is related to high density ICs, especially those having low or modest numbers of inputs/outputs or bonding pads, further to devices using an electrically conductive or metallic substrate, to which they are usually connected by wire bonding, and also to devices requiring small package outlines and low profiles. These ICs can be found in many semiconductor device families such as processors, digital and analog devices, mixed signal and standard linear and logic products, telephone, RF and telecommunications devices, intelligent power devices, and both large and small area chip categories. The invention helps to insure built-in quality and reliability in applications such as cellular communications, pagers, hard disk drives, laptop computers, and medical instrumentation.

The invention provides some material modifications and several simplifications of basic process steps commonly practiced in semiconductor assembly and packaging technology so that significant manufacturing cost reductions are achieved. The chips are mounted on substrates provided as thin foils in the thickness range of about 10 to 75 $\mu$m. In this thickness range, the foils respond to the pressure during conventional transfer molding processes, move against the steel walls of the mold cavity and align smoothly to the surface contours of the walls. Dimples reaching into the molded material, yet covered with a solderable surface, can thus be created; they serve as depressions holding the solder "balls" reliably and can be used to best advantage in solder attachments. The amount of deformation, or "inside curvature", to which certain foil materials can stretch in order to move from their original flat configuration to a curved configuration, has been determined by this invention. Ball-receiving depressions can be created between about 150 and 230 $\mu$m deep using an annealed copper foil of about 30 to 40 $\mu$m thickness.

It is an aspect of the present invention to be applicable to a variety of different ball grid array and chip-scale packages, especially those with a "ball" count of about 4 to 80. The most frequently used range is between about 8 and 48 "balls".

Another aspect of the present is to simplify the positioning of pre-fabricated solder balls on the device package by creating ball-receiving depressions in the flat package contour during the package molding process.

Another aspect of the present invention is to strengthen the solder ball attachment to the package by enlarging the attachment area.

Another aspect of the present invention is to enhance the package reliability by improving the adhesion between the molding compound and the metal foil used for electrical contacts to the outside world.

Another aspect of the present invention is to introduce manufacturing steps which contribute to the trends towards packages with lower overall profiles and smaller outlines, thus contributing to device space conservation.

Another aspect of the present invention is to improve product quality by process simplification, and to enhance reliability assurance by controlling thermomechanical stress, minimizing moisture absorption, and general in-process control at no extra cost.

Another aspect of the present invention is to introduce assembly concepts for thin profile packages which are flexible so that they can be applied to many families of semiconductor products, and are general so that they can be applied to several future generations of products.

These aspects have been achieved by the teachings of the invention concerning methods suitable for mass production. Various modifications have been successfully employed to satisfy different selections of product geometries and materials.

In one embodiment of the present invention, the size of the ball-receiving depression and thus the stretch of the foil material necessary to achieve this depression is used to produce devices of certain low profiles.

In another embodiment of the invention, the number of depressions and the arrangement in rows of solder ball receptors is used to produce devices of certain small ball grid array and chip-scale package outlines.

In another embodiment of the invention, the shape of the depressions has been modified from semi-spherical to truncated pyramid. This modification not only enhances solder ball attachment and molding compound adhesion to the metal foil, but also lowers the cost of manufacturing the bottom half of the mold by simplifying the work and the tools needed for preparing the surface contours of the steel.

In another embodiment of the invention, a simple mechanical grinding technique is employed to achieve electrical separation of the package metal contacts from each other, while avoiding stress between the molded package and the metal foil during this process step.

In another embodiment of the invention, the depressions are filled with solder paste in order to create solder bumps in place of using pre-fabricated solder balls.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1A is a top view of the ball grid array device.

FIG. 1B is a simplified combined side and partial cross sectional view of a ball grid array package according to the invention.

FIG. 1C is a simplified bottom view of a ball grid array package according to the invention.

FIGS. 2A and 2B are schematic and simplified cross sectional views through a portion of a ball grid array showing two embodiments according to the invention.

FIGS. 3A through 3C are simplified and schematic cross-sections through a mold cavity illustrating the process of creating a device according to the invention.

DETAILED DESCRIPTION OF THE PREFERRED EMBODIMENTS

The present invention is related to integrated circuits (ICs) having small outline and low profile ball grid array and chip-scale packages. As defined herein, the term "outline" relates to the overall width and length of the IC package of the present invention. The outline of the package is also referred to as the footprint of the package, because it defines the surface area on a wiring or assembly board that the package will occupy. The term "chip-scale package" is used with two connotations. In the first connotation, the packages have an outline adding less than 20% to the chip area; a chip-scale package which has only the size of the chip itself, is often referred to as "chip-size package". In the second connotation, a "chip-scale package" refers simply to a small-size ball grid array.

The term "profile" refers to the thickness or height of the IC package. This definition does not include the height of the solder balls before they are reflown in board attachment.

The term solder "ball" used herein does not imply that the solder contacts are necessarily spherical. They may have various forms, such as hemispherical, half-dome, truncated cone, or generally bump. The exact shape is a function of the deposition technique (such as evaporation, plating, or pre-fabricated units) and reflow technique (such as infrared or radiant heat), and the material composition. Several methods are available to achieve consistency of geometrical shape by controlling amount of material and uniformity of reflow temperature. The solder "balls" may comprise a lead/tin mixture or conductive adhesive compounds.

Figure 1A:
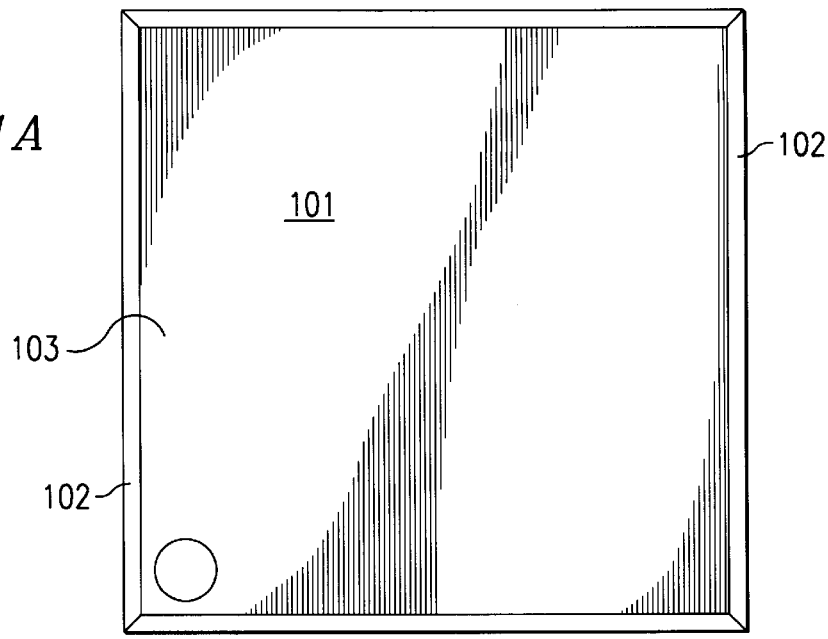
FIGS. 1A, 1B and 1C are simplified views of a ball grid array device having 40 dimples according to an embodiment of the invention.
Figure 1B:
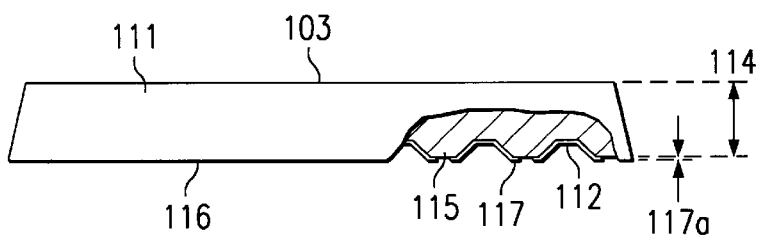
Figure 1C:
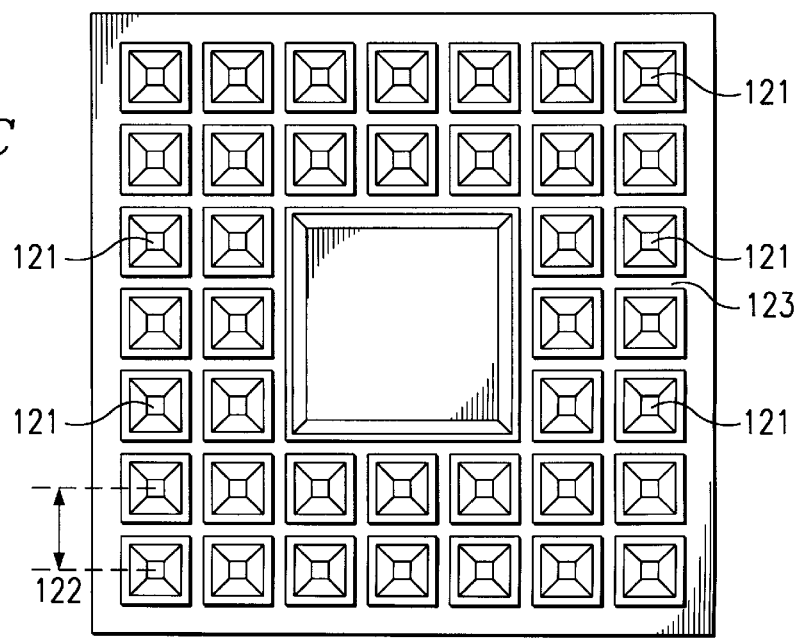

As an example of a preferred embodiment of the present invention, FIGS. 1A through 1C show different views of a square-shaped BGA for 40 connections. FIG. 1A is a top view of the package showing the plastic encapsulation material 101 (typically an epoxy-based thermoset material as commonly used in transfer molding processes) forming a generally flat surface 103. The side length 102 in the example of FIG. 1A is 8.0 mm; the invention, however, can easily be applied to BGA and CSP devices with square or rectangular outline and a side length in the range from about 4.0 to 12.0 mm.

FIG. 1B is a side view of the same BGA, with a portion shown as a cross section. The package has a generally flat top surface 103 and a generally flat bottom surface 116. The thickness 114 of the package is 1.0 mm in this example. As the cross section (shaded part 115) shows, the molded plastic 111 extends into all the depressions 112, which intrude into the generally flat bottom surface 116. It is a pivotal aspect of the present invention that these depressions 112 are formed in the same plastic molding process which is employed to encapsulate the device. These depressions 112 may be shaped as portions of a sphere. Consequently, they may be referred to as "dimples". Other shapes of depressions 112 include truncated cones or truncated pyramids, or any other three-dimensional form conveniently manufacturable. FIG. 1B depicts an array of several of these dimples 112. The metallization 117 of the dimples and its thickness 117$a$ are described in more detail in FIGS. 2A and 2B.

In a bottom view of the BGA package, FIG. 1C shows two rows of these dimples 121 arranged as solder balls would be in conventional BGAs. In the example of FIG. 1C, there are a total of 40 dimples. While the invention may be applied to any number of dimples, the preferred number is between 4 and 80. The pitch 122 between the dimples in the example of FIG. 1C is 1.0 mm; the separation 123 between the dimples may be between 20 and 200 $\mu$m wide. The invention is applicable to any arrangement of the dimples including the creation of "dummy" dimples not serving electrical connections.

More detail as well as the electrical functions of the dimples are explained schematically in FIGS. 2A and 2B, showing the cross section of a portion of the BGA example of FIG. 1B. The pressure applied to the compound 201 during the molding process is forming the dimples 202a and 202b. The depth 203 of the dimples is in the range between about 0.1 to 0.25 mm, and the diameter 204 at the widest opening of the depressions is between about 0.5 and 0.75 mm.

It is pivotally important for the present invention that the outside of the dimples have an electrically conductive and solderable surface 205. It comprises a metal foil having a thickness 206 in the range between about 10 and 75 $\mu$m. A preferred thickness range of the metal foil is about 30 to 40 $\mu$m. The foil may be made of a material selected from a group consisting of copper, copper alloys, iron-nickel alloys, aluminum, steel, and invar. Suitable copper and copper alloy foils are, for instance, produced by Olin Corporation, Waterbury, Conn., USA.

The solderable surface of the foil, facing the outside of the dimples, is selected from a group consisting of copper, nickel, palladium, silver, gold and platinum. Another option is a deposited layer of tin-lead, tin-silver tin-indium, and other solder alloys covering the outside of the dimple. A preferred embodiment is clean copper and highly activated solder paste to attach solder balls. Another embodiment consists of filling the dimples with solder paste to form solder bumps in place of solder balls (see FIG. 3F). The choice of the material depends on the solder reflow technique employed (for instance, time-temperature process, availability of solder paste or flux).

FIGS. 2A and 2B illustrate that the dimples 202 are electrically connected by wire bonds 207 to the terminals of the integrated circuit (see also FIGS. 3A to 3D). Following the commonly practiced wire bonding technology, the stitch of the bonding wire is attached to the metal of the dimple, and the ball of the bonding wire to the terminal (contact pad) of the IC chip.

For electrical separation, the metal foils covering the dimples have to be mechanically separated from each other. The separation is indicated in FIG. 2A by grooves 208, produced, for example, by a mechanical cut using a saw blade (width between about 130 to 170 $\mu$m). In FIG. 2B, the separation is indicated by the complete removal of the foil between the dimples, effectively produced by mechanical grinding. Because grinding is a low cost and easily controlled batch process, this is the preferred technology.

FIG. 2A shows the dimples 202a formed as portions of a hemisphere. They are rounded so that the prefabricated solder balls 210, to be attached after completing the fabrication process of the device, fit easily into the depressions. FIG. 2B shows the dimples 202b formed as truncated pyramids. This three-dimensional geometry is the preferred embodiment of the invention, because of the easy manner in which the truncated pyramids can be manufactured as elevations in the bottom half of the mold (see FIG. 3A). The truncated pyramids 202b offer large attachment area for the prefabricated solder balls 210 after completing the device fabrication.

Dimples of hemispherical as well as truncated pyramid shape increase significantly the adhesion area between the molding compound and the metal foil. Consequently, the adhesion strength is much enhanced, resulting in packages, as fabricated by the present invention, considerably less sensitive to delamination by stress or moisture.

Figure 3B:
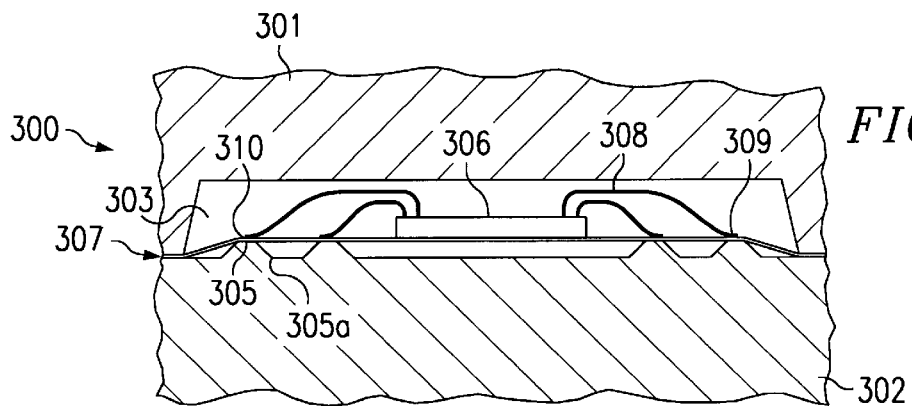
Figure 3C:
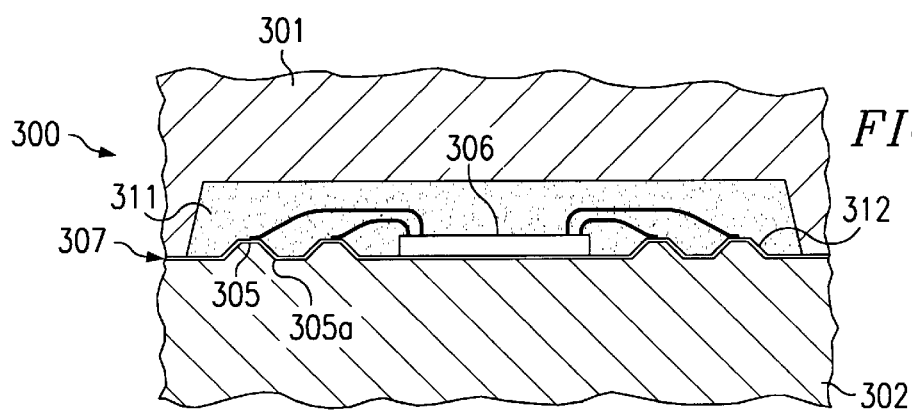

FIGS. 3A through 3E illustrate the method for fabricating the IC device according to the invention. In FIG. 3A, a simplified and schematic cross section through a mold, generally designated 300, shows the top half 301 of the mold, the bottom half 302, and the cavity 303. The bottom half 302 features a generally flat surface contour 304 including a plurality of knolls 305. These knolls have a size and shape commensurate with the goal of creating molded depressions receiving solder balls in the devices-to-be-encapsulated. The edges 305a of knolls 305 are polished in order to avoid sharp edges. The knolls may have a shape selected from a group consisting of hemisphere, truncated cone, truncated pyramid, and related geometries which can be manufactured in the mold steel at low cost. In FIGS. 3A, 3B and 3C, the knolls are depicted as truncated pyramids.

FIG. 3A further shows the cavity 303 holding a pre-assembled IC chip 306. In other embodiments of the invention, a plurality of IC chips and/or other electronic components may be pre-assembled. Chip 306 is attached onto the first surface 307a of an electrically conductive sheet-like substrate 307; according to the invention, this substrate preferably is a metal foil about 10 to 75 $\mu$m thick. The second surface 307b of substrate 307 is prepared so that it is solderable. The chip attachment is accomplished by an adhesive epoxy or polyimide film. The input/output terminals of chip 306 are connected, preferably by wires 308, to the substrate 307. Typically, the wires 308 are connected by ball bonding to the chip terminals and by stitch bonding to the substrate; however, wedge bonding of both wire ends is a viable alternative.

The chip, pre-assembled on the substrate, is placed on the bottom mold half 302 so that the locations 309 where the wires are welded onto the substrate 307 are aligned relative to the respective locations of the knolls 305 in the bottom mold half. This alignment is generally designated 310 as indicated in FIG. 3B. The mold is then closed (see FIG. 3B).

As indicated in FIG. 3C, encapsulation material 311 is pressured into cavity 303 until the cavity is filled with material. Preferably, established transfer molding processes and controls are used, in conjunction with epoxy-based molding compounds (transfer temperatures are usually between about 170 and 180° C., transfer times between about 6 and 18 s). Typical ram pressures range from about 500 to 700 psi, which produces a pressure in the mold cavity (dependent on cavity size) of between about 800 to 1600 psi. It is important for the present invention that in the molding process and at these pressures, foil 307 is moved against the surface contours of bottom mold half 302, especially onto mold knolls 305. The molding temperature is then allowed to drop; within about 90 to 130 s, the molding compound solidifies and polymerizes at least partially so that the mold can be opened. Depressions 312 have thus been produced on the body of the solidified encapsulation material, surrounded on the inner dimple surface by foil 307. As FIG. 3C shows, each dimple has a wire bond connecting it to a respective terminal of chip 306.

As mentioned above, the formation of the dimples increases the surface area between molding compound and dimple foil significantly; consequently, the adhesion between the molding compound and the metal foil is enhanced, a fact which reduces the stress and moisture sensitivity of the finished device and thus improves its reliability.

Figure 3D:
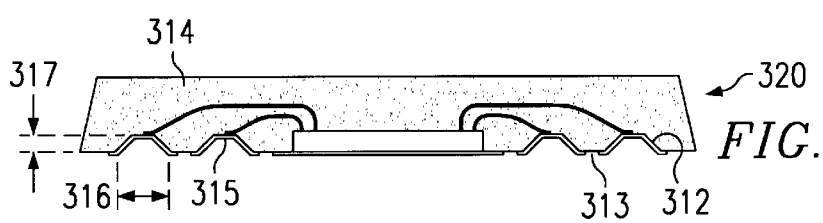
FIG. 3D is a simplified and schematic cross section through a device embodiment fabricated by the process of the invention.

FIG. 3D displays a finished device, generally designated 320. In this device, the dimples 312 are electrically separated from each other by openings 313. These openings may be cut by high-speed saws, focused lasers, high-pressure liquid jets or any other low-cost technique. As pointed out in conjunction with FIG. 2B, grinding is an alternative advantageous technique for dimple separation in some device designs. If more than one unit was placed into cavity 303, the units can be mechanically singulated from each other, typically by sawing along the (vertical) edges 314. By this method, a plurality of devices similar to 320, with dimples 312 offering depressions for receiving solder balls and having solderable surfaces 315, can be fabricated in low-cost processes.

Referring to FIG. 3D, the size of dimples 312, as given by diameter 316 and depth 317, is predominantly determined by the mechanical properties of the metal foil 307. With suitable microcrystallinity and mechanical and thermal history, a copper foil of about 30 to 50 $\mu$m thickness can elongate by about 15 to 22%. This means that for a desired dimple diameter of about 0.7 mm, a dimple depth of about 0.2 mm can be achieved. With this depth, BGA and CSP devices of 1.0 mm profile can be produced which include the "ball" height in the overall thickness.

Figure 3E:
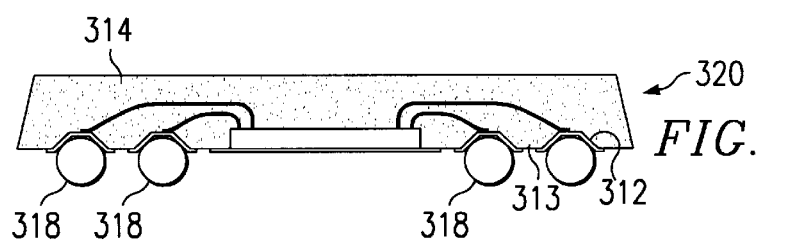
FIG. 3E is a simplified and schematic cross section through another device embodiment fabricated by the process of the invention.

FIG. 3E shows pre-fabricated solder balls 318 positioned in and attached to the solderable surface of the dimples. Solder balls are available in the wide range of diameters from 0.1 to 1.0 mm; preferred diameters are 0.3 to 0.5 mm for devices with ball pitches up to 1.0 mm, and 0.6 to 0.9 mm diameter for devices with only few connections and ball pitches of 1.0 to 1.27 mm. The ball pitch, as shown in FIG. 1C, is usually between 0.8 to 1.0 mm, but may be smaller or larger in specific devices.

Figure 3F:
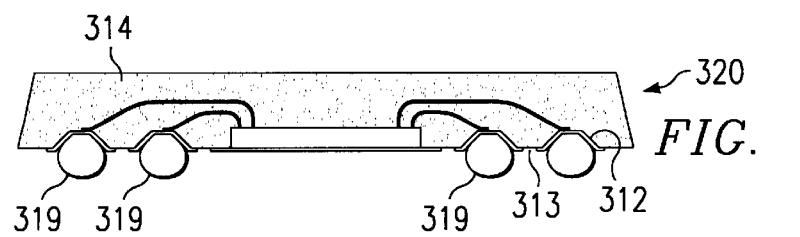
FIG. 3F is a simplified and schematic cross section through another device embodiment fabricated by the process of the invention.

FIG. 3F illustrates an embodiment of the invention replacing the pre-fabricated solder balls by an amount of solder paste positioned in each dimple which reflows into solder bumps 319. This embodiment of the invention simplifies the attachment process of the device to motherboards, creates devices of ultra-thin profiles, and is enabled by the solder-receiving depressions made according to the invention.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, by using suitably flexible foils, the shape of the molded "ball"-simulating elevations can be modified to elongated structures. It is therefore intended that the appended claims encompass any such modifications or embodiments.

We claim:

1. A semiconductor device comprising:
    an integrated circuit chip, having at least one input/output terminal;
    a body of encapsulating material molded around said chip, forming a generally flat surface including at least one dimple having a suitable size and shape to receive a solder ball or solder paste; and
    said dimple having an electrically conductive, solderable metal foil surface connected to said terminal, said foil having a thickness of about 10 to 75 $\mu$m.

2. The device according to claim 1 further having a solder ball, solder paste or conductive adhesive positioned in and attached to said dimple.

3. The device according to claim 1 wherein said dimple has a size between about 0.6 and 0.8 mm diameter and between about 0.20 and 0.25 mm depth.

4. The device according to claim 1 wherein said conductive surface of said dimple comprises a metal foil of about 30 to 40 $\mu$m thickness.

5. The device according to claim 1 wherein said foil comprises a material selected from a group consisting of copper, copper alloys, iron-nickel alloys, aluminum, steel, and invar.

6. The device according to claim 1 wherein said conductive surface of said dimple is connected to said chip terminal by a span of bonding wire, one end of said span being attached to said surface and the other end to said terminal.

7. The device according to claim 1 wherein said dimple has a shape selected from a group consisting of hemisphere, truncated cone, and truncated pyramid.

8. The device according to claim 1 wherein said dimple is formed in the molding process for encapsulating said chip.

9. The device according to claim 5 wherein said foil further has a solderable surface facing said dimple selected from a group consisting of copper, nickel, palladium, silver, gold, platinum, tin-lead, tin-silver, tin-indium and other solder alloys.

* * * * *